(12) United States Patent
Rokhsaz

(10) Patent No.: US 11,064,373 B2
(45) Date of Patent: *Jul. 13, 2021

(54) WIRELESS SENSOR INCLUDING AN RF SIGNAL CIRCUIT

(71) Applicant: RFMicron, Inc., Austin, TX (US)

(72) Inventor: Shahriar Rokhsaz, Austin, TX (US)

(73) Assignee: RFMicron, Inc., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/846,951

(22) Filed: Apr. 13, 2020

(65) Prior Publication Data

US 2020/0382969 A1    Dec. 3, 2020

Related U.S. Application Data

(60) Continuation of application No. 16/183,578, filed on Nov. 7, 2018, now Pat. No. 10,623,970, which is a
(Continued)

(51) Int. Cl.
*H04B 5/00* (2006.01)
*H04W 24/02* (2009.01)
(Continued)

(52) U.S. Cl.
CPC ........ *H04W 24/02* (2013.01); *G06K 7/10198* (2013.01); *G06K 7/10316* (2013.01);
(Continued)

(58) Field of Classification Search
CPC combination set(s) only.
See application file for complete search history.

(56) References Cited

U.S. PATENT DOCUMENTS 5,177,470 A  *  1/1993  Repas ................... A01C 7/105
                                                        340/684
5,345,231 A     9/1994  Koo
                        (Continued)

*Primary Examiner* — Cindy Trandai
(74) *Attorney, Agent, or Firm* — Garlick & Markison; Timothy W. Markison; Patricia M. Healy

(57) ABSTRACT

A radio frequency identification (RFID) tag includes an antenna structure operable to receive a radio frequency (RF) signal, an RF signal circuit operable to, when enabled, produce the RF signal, a sensing element operably coupled to the antenna structure, a memory, and a processing module. When in a calibration mode, the processing module adjusts the input impedance until a measured power level is substantially equal to the desired input power level, and generates a first digital value based on the amount of the adjustment a power difference between a measured first input power level and a desired power level, and stores the first digital value in the memory, where the first digital value is representative of a known condition. In a sense mode, the processing module adjusts the input impedance until a second measured power level is substantially equal to the desired input power level, and generates a second digital value based on the amount of the adjustment a power difference between a measured first input power level and a desired power level, and the desired power level, and stores the second digital value in the memory, where the second digital value is representative of an unknown condition.

16 Claims, 6 Drawing Sheets

Related U.S. Application Data continuation of application No. 15/272,907, filed on Sep. 22, 2016, now Pat. No. 10,149,177, which is a continuation-in-part of application No. 14/256,877, filed on Apr. 18, 2014, now Pat. No. 9,785,807, which is a continuation-in-part of application No. 13/209,420, filed on Aug. 14, 2011, now Pat. No. 8,749,319, and a continuation-in-part of application No. 13/209,425, filed on Aug. 14, 2011, now Pat. No. 9,048,819, and a continuation-in-part of application No. 13/467,925, filed on May 9, 2012, now Pat. No. 10,224,902, which is a continuation-in-part of application No. 13/209,425, filed on Aug. 14, 2011, now Pat. No. 9,048,819, which is a continuation-in-part of application No. 12/462,331, filed on Aug. 1, 2009, now Pat. No. 8,081,043, which is a division of application No. 11/601,085, filed on Nov. 18, 2006, now Pat. No. 7,586,385, application No. 13/209,420, which is a continuation-in-part of application No. 12/462,331, filed on Aug. 1, 2009, now Pat. No. 8,081,043.

(60) Provisional application No. 62/221,907, filed on Sep. 22, 2015, provisional application No. 61/814,241, filed on Apr. 20, 2013, provisional application No. 61/833,150, filed on Jun. 10, 2013, provisional application No. 61/833,167, filed on Jun. 10, 2013, provisional application No. 61/833,265, filed on Jun. 10, 2013, provisional application No. 61/871,167, filed on Aug. 28, 2013, provisional application No. 61/875,599, filed on Sep. 9, 2013, provisional application No. 61/896,102, filed on Oct. 27, 2013, provisional application No. 61/929,017, filed on Jan. 18, 2014, provisional application No. 61/934,935, filed on Feb. 3, 2014, provisional application No. 61/428,170, filed on Dec. 29, 2010, provisional application No. 61/485,732, filed on May 13, 2011.

(51) Int. Cl.
  *H04W 52/02* (2009.01)
  *H04B 1/40* (2015.01)
  *H03J 3/20* (2006.01)
  *G06K 19/07* (2006.01)
  *G06K 7/10* (2006.01)
  *H04W 84/18* (2009.01)
  *H04W 76/14* (2018.01)

(52) U.S. Cl.
  CPC ..... *G06K 7/10346* (2013.01); *G06K 7/10366* (2013.01); *G06K 19/0717* (2013.01); *G06K 19/0723* (2013.01); *H03J 3/20* (2013.01); *H04B 1/40* (2013.01); *H04W 52/0261* (2013.01); *H03J 2200/10* (2013.01); *H04W 76/14* (2018.02); *H04W 84/18* (2013.01); *Y02D 30/70* (2020.08)

(56) References Cited

U.S. PATENT DOCUMENTS

| | | | | |
|---|---|---|---|---|
| 6,060,991 A * | 5/2000 | Hsieh | | G01N 33/0031 340/577 |
| 9,991,937 B2 * | 6/2018 | Kim | | H04B 5/0081 |
| 10,018,744 B2 * | 7/2018 | Roy | | G01V 3/104 |
| 10,116,353 B2 * | 10/2018 | Jung | | H04W 4/80 |
| 10,447,465 B2 * | 10/2019 | Stott | | H04L 7/0008 |
| 2002/0105436 A1 | 8/2002 | Bell | | |
| 2003/0151450 A1 | 8/2003 | Nguyen | | |
| 2004/0113790 A1 | 6/2004 | Hamel | | |
| 2004/0136436 A1 | 7/2004 | Kinspan | | |
| 2005/0085316 A1 | 4/2005 | Barr | | |
| 2007/0010295 A1 | 1/2007 | Greene | | |
| 2007/0018819 A1 | 1/2007 | Streeb | | |
| 2007/0075140 A1 | 4/2007 | Guez | | |
| 2007/0090926 A1 | 4/2007 | Potyrailo | | |
| 2007/0210923 A1 | 9/2007 | Butler | | |
| 2007/0232236 A1 | 10/2007 | Kasha | | |
| 2008/0079398 A1 | 4/2008 | Li | | |
| 2008/0186137 A1 | 8/2008 | Butler | | |
| 2008/0227478 A1 | 9/2008 | Greene | | |
| 2009/0038623 A1 | 2/2009 | Farbarik | | |
| 2009/0108805 A1 | 4/2009 | Liu | | |
| 2009/0186584 A1 | 7/2009 | Lambrecht | | |
| 2009/0207037 A1 | 8/2009 | Wiberg | | |
| 2010/0039234 A1 | 2/2010 | Soliven | | |
| 2010/0179389 A1 | 7/2010 | Moroney | | |
| 2010/0245052 A1 | 9/2010 | Kitayoshi | | |
| 2010/0265189 A1 | 10/2010 | Rofougaran | | |
| 2010/0279751 A1 | 11/2010 | Pourseyed | | |
| 2010/0286841 A1 | 11/2010 | Subbloie | | |
| 2010/0308974 A1 | 12/2010 | Rowland | | |
| 2010/0326145 A1 * | 12/2010 | Powers | | E05B 39/005 70/158 |
| 2010/0327766 A1 | 12/2010 | Recker | | |
| 2011/0081857 A1 | 4/2011 | Lee | | |
| 2011/0130093 A1 | 6/2011 | Walley | | |
| 2011/0158329 A1 | 6/2011 | Oettinger | | |
| 2011/0221569 A1 | 9/2011 | Hamel | | |
| 2012/0063505 A1 | 3/2012 | Okamura | | |
| 2012/0068003 A1 | 3/2012 | Bajekal | | |
| 2012/0081145 A1 | 4/2012 | Lee | | |
| 2012/0149303 A1 | 6/2012 | Moes | | |
| 2012/0155344 A1 | 6/2012 | Wiley | | |
| 2012/0161536 A1 * | 6/2012 | Kamata | | H02J 7/025 307/104 |
| 2012/0235636 A1 | 9/2012 | Partovi | | |
| 2013/0026847 A1 * | 1/2013 | Kim | | B60L 53/36 307/104 |
| 2013/0095759 A1 | 4/2013 | Andersen | | |
| 2013/0022649 A1 | 8/2013 | Gudem | | |
| 2013/0204202 A1 | 8/2013 | Trombly | | |
| 2013/0214611 A1 | 8/2013 | Bae | | |
| 2013/0285606 A1 | 10/2013 | Ben-Shalom | | |
| 2014/0045425 A1 | 2/2014 | Roh | | |
| 2014/0070898 A1 | 3/2014 | Shirinfar | | |
| 2014/0080409 A1 | 3/2014 | Frankland | | |
| 2014/0085057 A1 * | 3/2014 | Horst | | G06K 7/10316 340/10.51 |
| 2014/0107448 A1 | 4/2014 | Liu | | |
| 2014/0163316 A1 | 6/2014 | Koide | | |
| 2014/0285336 A1 * | 9/2014 | Kates | | G08B 17/10 340/501 |
| 2014/0350872 A1 | 11/2014 | Xu | | |
| 2015/0054453 A1 | 2/2015 | White et al. | | |
| 2015/0079903 A1 | 3/2015 | Song | | |
| 2015/0188671 A1 | 7/2015 | Distasi | | |
| 2015/0243432 A1 | 8/2015 | Laifenfeld | | |
| 2015/0270876 A1 | 9/2015 | Kim | | |
| 2015/0355037 A1 | 12/2015 | Cottin | | |
| 2015/0358912 A1 * | 12/2015 | Tsukamoto | | G06Q 20/3278 370/311 |
| 2016/0034724 A1 * | 2/2016 | Zumsteg | | G06K 7/10386 235/439 |
| 2016/0191088 A1 | 6/2016 | Turlikov | | |
| 2016/0310077 A1 | 10/2016 | Hunter | | |
| 2017/0223807 A1 * | 8/2017 | Recker | | H02J 13/0017 |

* cited by examiner wireless communication system 10 sensor 16

WIRELESS SENSOR INCLUDING AN RF SIGNAL CIRCUIT

CROSS REFERENCE TO RELATED PATENTS

The present U.S. Utility Patent Application claims priority pursuant to 35 U.S.C. § 120 as a continuation of U.S. Utility application Ser. No. 16/183,578, entitled "WIRELESS SENSOR INCLUDING AN RF SIGNAL CIRCUIT", filed Nov. 7, 2018, issuing as U.S. Pat. No. 10,623,970 on Apr. 14, 2020, which is a continuation of U.S. Utility application Ser. No. 15/272,907, entitled "WIRELESS SENSOR INCLUDING AN RF SIGNAL CIRCUIT", filed Sep. 22, 2016, now U.S. Pat. No. 10,149,177, issued on Dec. 4, 2018, which claims priority pursuant to 35 U.S.C. § 119(e) to U.S. Provisional Application No. 62/221,907, entitled "Active Self-Calibrating RFID Sensors", filed Sep. 22, 2015, which is hereby incorporated herein by reference in its entirety and made part of the present U.S. Utility Patent Application for all purposes.

U.S. Utility application Ser. No. 15/272,907 also claims priority pursuant to 35 U.S.C. § 120 as a continuation-in-part of U.S. Utility application Ser. No. 14/256,877, entitled "METHOD AND APPARATUS FOR SENSING ENVIRONMENT USING A WIRELESS PASSIVE SENSOR", filed Apr. 18, 2014, now U.S. Pat. No. 9,785,807, issued on Oct. 10, 2017, which claims priority pursuant to 35 U.S.C. § 119(e) to U.S. Provisional Application No. 61/814,241, entitled "RFID ENVIRONMENTAL SENSOR", filed Apr. 20, 2013; U.S. Provisional Application No. 61/833,150, entitled "RESONANT ANTENNA", filed Jun. 10, 2013; U.S. Provisional Application No. 61/833,167, entitled "RFID TAG", filed Jun. 10, 2013; U.S. Provisional Application No. 61/833,265, entitled "RFID TAG", filed Jun. 10, 2013; U.S. Provisional Application No. 61/871,167, entitled "RESONANT ANTENNA", filed Aug. 28, 2013; U.S. Provisional Application No. 61/875,599, entitled "CMF ACCURATE SENSOR", filed Sep. 9, 2013; U.S. Provisional Application No. 61/896,102, entitled "RESONANT ANTENNA", filed Oct. 27, 2013; U.S. Provisional Application No. 61/929,017, entitled "RFID ENVIRONMENTAL SENSOR", filed Jan. 18, 2014; U.S. Provisional Application No. 61/934,935, entitled "RFID ENVIRONMENTAL SENSOR", filed Feb. 3, 2014; all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/209,420, entitled "METHOD AND APPARATUS FOR DETECTING RF FIELD STRENGTH", filed Aug. 14, 2011, now U.S. Pat. No. 8,749,319, issued on Jun. 10, 2014, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,420 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/209,425, entitled "METHOD AND APPARATUS FOR DETECTING RF FIELD STRENGTH", filed Aug. 14, 2011, now U.S. Pat. No. 9,048,819, issued on Jun. 2, 2015, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,425 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

U.S. Utility application Ser. No. 14/256,877 also claims priority pursuant to 35 U.S.C. § 120 as a continuation-in-part of U.S. Utility application Ser. No. 13/467,925, entitled "ROLL-TO-ROLL PRODUCTION OF RFID TAGS", filed May 9, 2012, now U.S. Pat. No. 10,224,902, issued on Mar. 5, 2019, which is a continuation-in-part of U.S. Utility application Ser. No. 13/209,425, entitled "METHOD AND APPARATUS FOR DETECTING RF FIELD STRENGTH", filed Aug. 14, 2011, now U.S. Pat. No. 9,048,819, issued on Jun. 2, 2015, which claims priority pursuant to 35 U.S.C. § 119(e) to U.S. Provisional Application No. 61/428,170, entitled "METHOD AND APPARATUS FOR VARYING AN IMPEDANCE", filed Dec. 29, 2010 and U.S. Provisional Application No. 61/485,732, entitled "METHOD AND APPARATUS FOR SENSING ENVIRONMENTAL CONDITIONS USING AN RFID TAG", filed May 13, 2011, all of which are hereby incorporated herein by reference in their entirety and made part of the present U.S. Utility Patent Application for all purposes.

U.S. Utility application Ser. No. 13/209,425 also claims priority pursuant to 35 U.S.C. § 120 as a continuation-in-part of U.S. Utility application Ser. No. 12/462,331, entitled "METHOD AND APPARATUS FOR VARYING AN IMPEDANCE", filed Aug. 1, 2009, now U.S. Pat. No. 8,081,043, issued on Dec. 20, 2011, which is a divisional of U.S. Utility application Ser. No. 11/601,085, entitled "METHOD AND APPARATUS FOR VARYING AN IMPEDANCE", filed Nov. 18, 2006, now U.S. Pat. No. 7,586,385, issued on Sep. 8, 2009, all of which are hereby incorporated herein by reference in their entirety and made part of the present U.S. Utility Patent Application for all purposes.

BACKGROUND OF THE INVENTION

Technical Field of the Invention

This invention relates generally to wireless communications and more particularly to wireless sensors and applications thereof.

Description of Related Art

Wireless communication systems are known to include wireless transceivers that communication directly and/or over a wireless communication infrastructure. In direct wireless communications, a first wireless transceiver includes baseband processing circuitry and a transmitter to convert data into a wireless signal (e.g., radio frequency (RF), infrared (IR), ultrasound, near field communication (NFC), etc.). Via the transmitter, the first wireless transceiver transmits the wireless signal. When a second wireless transceiver is in range (e.g., is close enough to the first wireless transceiver to receive the wireless signal at a sufficient power level), it receives the wireless signal via a receiver and converts the signal into meaningful information (e.g., voice, data, video, audio, text, etc.) via baseband processing circuitry. The second wireless transceiver may wirelessly communicate back to the first wireless transceiver in a similar manner.

Examples of direct wireless communication (or point-to-point communication) include walkie-talkies, Bluetooth, ZigBee, Radio Frequency Identification (RFID), etc. As a more specific example, when the direct wireless communication is in accordance with RFID, the first wireless transceiver may be an RFID reader and the second wireless transceiver may be an RFID tag.

For wireless communication via a wireless communication infrastructure, a first wireless communication device transmits a wireless signal to a base station or access point, which conveys the signal to a wide area network (WAN) and/or to a local area network (LAN). The signal traverses the WAN and/or LAN to a second base station or access point that is connected to a second wireless communication device. The second base station or access point sends the signal to the second wireless communication device. Examples of wireless communication via an infrastructure include cellular telephone, IEEE 802.11, public safety systems, etc.

In many situations, direct wireless communication is used to gather information that is then communicated to a computer. For example, an RFID reader gathers information from RFID tags via direct wireless communication. At some later point in time (or substantially concurrently), the RFID reader downloads the gathered information to a computer via a direct wireless communication or via a wireless communication infrastructure.

In many RFID systems, the RFID tag is a passive component. As such, the RFID tag has to generate one or more supply voltages from the RF signals transmitted by the RFID reader. Accordingly, a passive RFID tag includes a power supply circuit that converts the RF signal (e.g., a continuous wave AC signal) into a DC power supply voltage.

Once powered, the RFID tag receives a command from the RFID reader to perform a specific function. For example, if the RFID tag is attached to a particular item, the RFID tag stores a serial number, or some other identifier, for the item. In response to the command, the RFID tag retrieves the stored serial number and, using back-scattering, the RFID tag transmits the retrieved serial number to the RFID reader.

BRIEF DESCRIPTION OF THE SEVERAL VIEWS OF THE DRAWING(S)

DETAILED DESCRIPTION OF THE INVENTION

Figure 1:
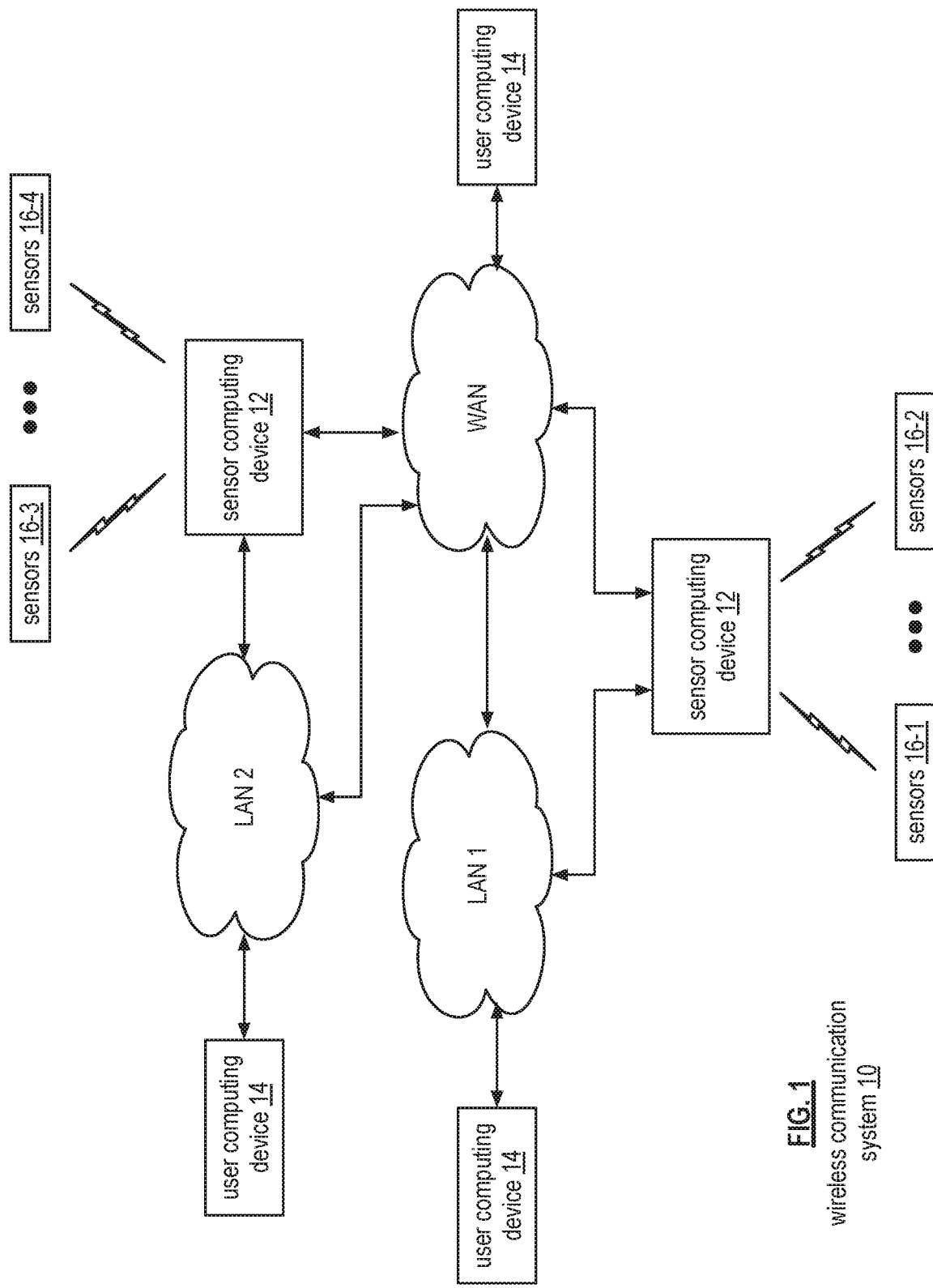
FIG. 1 is a schematic block diagram of an embodiment of a wireless communication system in accordance with the present invention.

FIG. 1 is a schematic block diagram of an embodiment of a communication system 10 that includes a plurality of sensor computing device 12, a plurality of user computing devices 14, a plurality of passive wireless sensors 16-1 through 16-4, one or more wide area networks (WAN), and one or more local area networks (LAN). The passive wireless sensors 16-1 through 16-4, when activated, sense one or more of a variety of conditions. For example, one passive wireless sensor senses for the presence, absence, and/or amount of moisture in a given location (e.g., in a room, in a manufactured item or component thereof (e.g., a vehicle), in a bed, in a diaper, etc.). As another example, a passive wireless sensor senses pressure on and/or in a particular item (e.g., on a seat, on a bed, in a tire, etc.)

As yet another example, a passive wireless sensor senses temperature within a space and/or of an item (e.g., surface temperature of the item, in a confined space such as a room or a box, etc.). As a further example, a passive wireless sensor senses humidity within a space (e.g., a room, a closet, a box, a container, etc.). As a still further example, a passive wireless sensor senses the presence and/or percentages of a gas within a space (e.g., carbon monoxide in a car, carbon monoxide in a room, gas within a food container, etc.). As an even further example, a passive wireless sensor senses the presence and/or percentages of a light within a space. As yet a further example, a passive wireless sensor senses the presence, percentages, and/or properties of one or more liquids in a solution. In one more example, a passive wireless sensor senses location proximity of one item to another and/or the proximity of the passive wireless sensor to an item (e.g., proximity to a metal object, etc.).

In general, the sensor computing devices 12 function to collect the sensed data from the passive wireless sensors and process the sensed data. For example, a passive wireless sensor generates a coded value representative of a sensed condition (e.g., amount of moisture). A sensor computing device 12 receives the coded value and processes it to determine an accurate measure of the sensed condition (e.g., a value corresponding to the amount of moisture such as 0% saturated, 50% saturated, 100% saturated, etc.).

The user computing devices 14 communication with one or more of the sensor computing devices 12 to gather the accurate measures of sensed conditions for further processing. For example, assume that the wireless communication system is used by a manufacturing company that has multiple locations for assembly of its products. In particular, LAN 1 is at a first location where a first set of components of products are processed and the LAN 2 is at a second location where second components of the products and final assembly of the products occur. Further assume that the corporate headquarters of the company is at a third location, where it communicates with the first and second locations via the WAN and LANs.

In this example, the sensor computing device 12 coupled to LAN 1 collects and processes data regarding the first set of components as sensed by passive wireless sensors 16-1 and 16-2. The sensor computing device 12 is able to communicate this data to the user computing device 14 coupled to the LAN 1 and/or to the computing device 14 at corporate headquarters via the WAN. Similarly, the sensor computing device 12 coupled to LAN 2 collects and processes data regarding the second set of components and final assembly as sensed by passive wireless sensors 16-3 and 16-4. This sensor computing device 12 is able to communicate this data to the user computing device 14 coupled to the LAN 2 and/or to the computing device 14 at corporate headquarters via the WAN. In such a system, real time monitor is available locally (e.g., via the LAN) and is further available non-locally (e.g., via the WAN). Note that any of the user computing devices 14 may receive data from any of the sensor computing devices 12 via a combination of LANs and the WAN.

Figure 2:
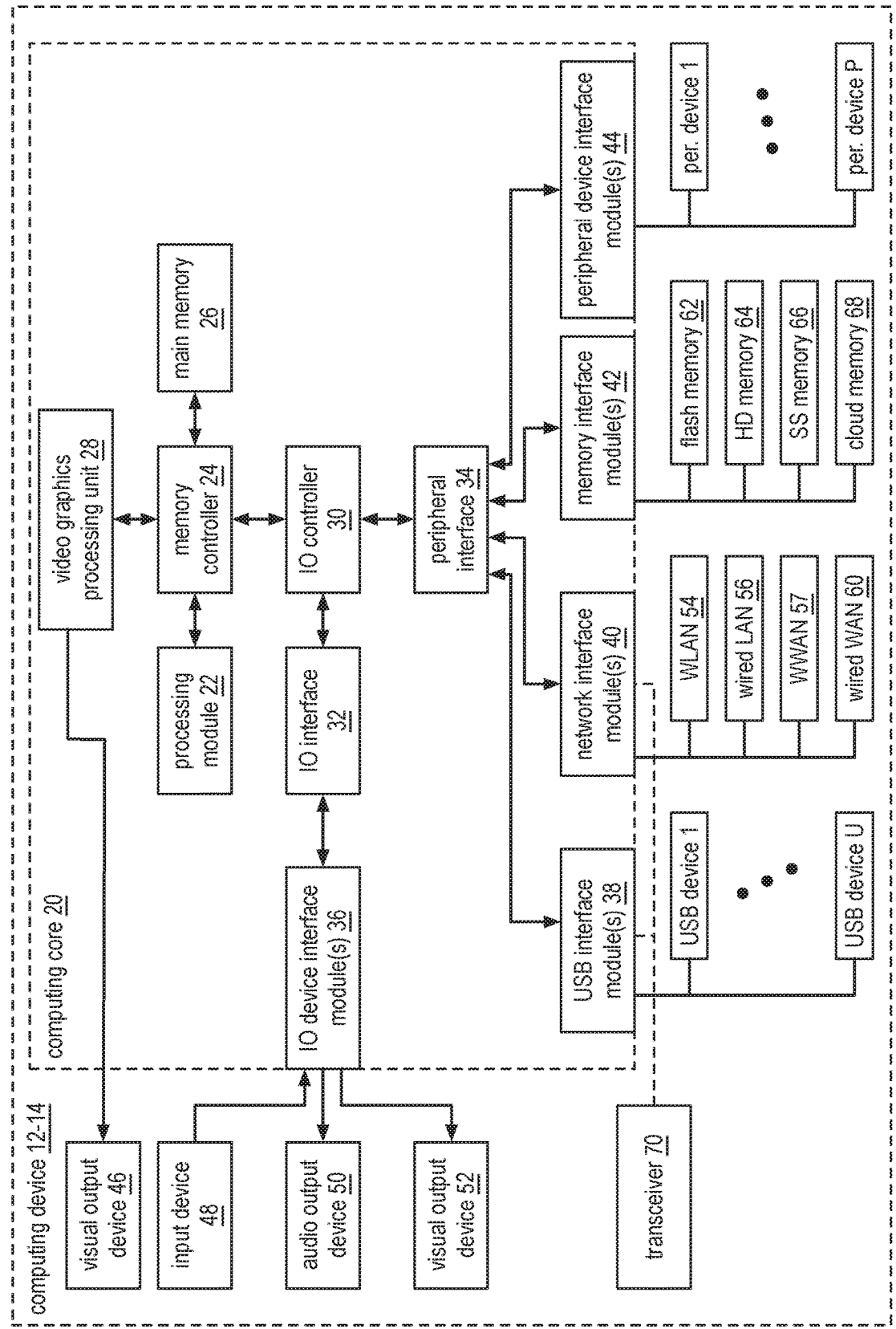
FIG. 2 is a schematic block diagram of an embodiment of a computing device in accordance with the present invention.

FIG. 2 is a schematic block diagram of an embodiment of a computing device 12 and/or 14 that includes a computing core 20, one or more input devices 48 (e.g., keypad, keyboard, touchscreen, voice to text, etc.), one or more audio output devices 50 (e.g., speaker(s), headphone jack, etc.), one or more visual output devices 46 and 52 (e.g., video graphics display, touchscreen, etc.), one or more universal serial bus (USB) devices, one or more networking devices (e.g., a wireless local area network (WLAN) device 54, a wired LAN device 56, a wireless wide area network (WWAN) device 57 (e.g., a cellular telephone transceiver, a wireless data network transceiver, etc.), and/or a wired WAN device 60), one or more memory devices (e.g., a flash memory device 62, one or more hard drives 64, one or more solid state (SS) memory devices 66, and/or cloud memory 68), one or more peripheral devices, and/or a transceiver 70.

The computing core 20 includes a video graphics processing unit 28, one or more processing modules 22, a memory controller 24, main memory 26 (e.g., RAM), one or more input/output (I/O) device interface module 36, an input/output (I/O) interface 32, an input/output (I/O) controller 30, a peripheral interface 34, one or more USB interface modules 38, one or more network interface modules 40, one or more memory interface modules 42, and/or one or more peripheral device interface modules 44. Each of the interface modules 36-44 includes a combination of hardware (e.g., connectors, wiring, etc.) and operational instructions stored on memory (e.g., driver software) that is executed by the processing module 22 and/or a processing circuit within the respective interface module. Each of the interface modules couples to one or more components of the computing device 12-14. For example, one of the IO device interface modules 36 couples to an audio output device 50.

As another example, one of the memory interface modules 42 couples to flash memory 62 and another one of the memory interface modules 42 couples to cloud memory 68 (e.g., an on-line storage system and/or on-line backup system).

The transceiver 70 is coupled to the computing core 20 via a USB interface module 38, a network interface module 40, a peripheral device interface module 44, or a dedicated interface module (not shown). Regardless of how the transceiver 70 is coupled to the computing core, it functions to communication with the passive wireless sensors.

Figure 3:
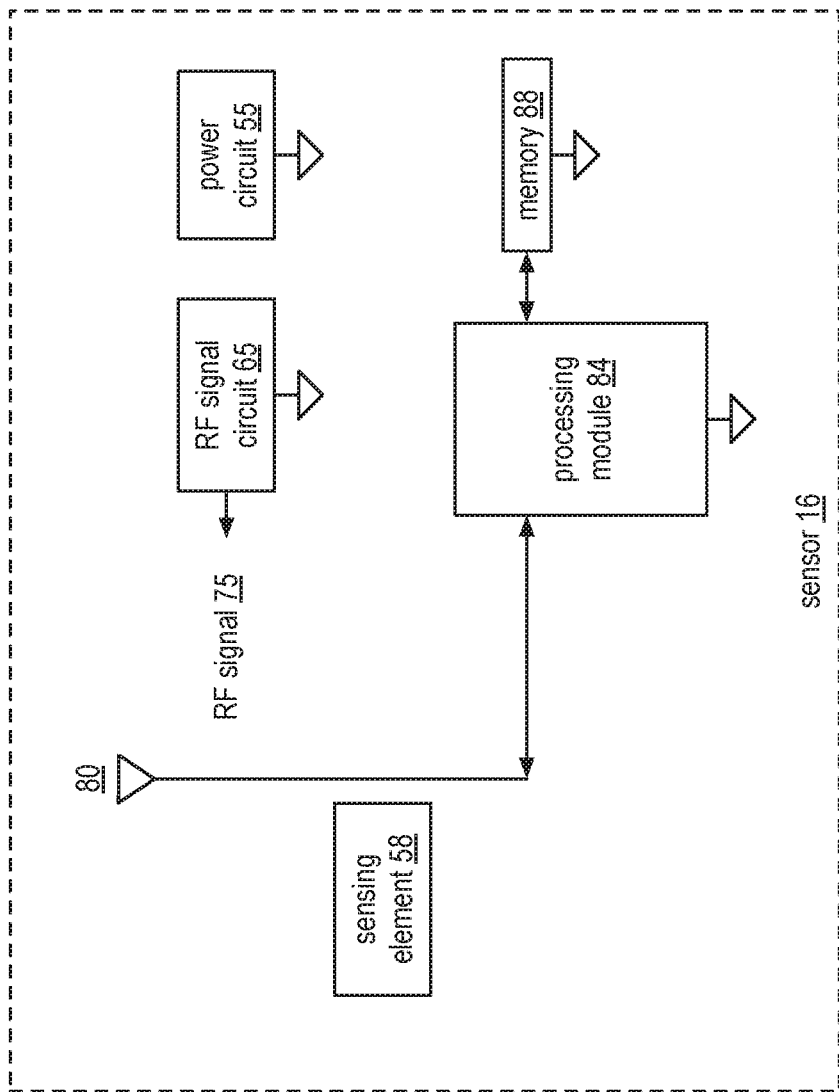
FIG. 3 is a schematic block diagram of an embodiment of a wireless sensor in accordance with the present invention.

FIG. 3 is a schematic block diagram of an embodiment of a wireless sensor 16 that includes an antenna structure 80, a radio frequency (RF) signal circuit 65, a power circuit 55, a processing module 84, memory 88, and one or more sensing elements 58. The memory 88 includes one or more of read-only memory, random access memory, volatile memory, non-volatile memory, static memory, dynamic memory, flash memory, cache memory, and/or any device that stores digital information.

The sensing element 58 may be a separate device or integrated into the antenna structure. In general, the sensing element 58 functions to affect the impedance of the antenna structure and/or other operational characteristics of the antenna structure 80 as an environment condition changes. For example, the sensing element senses moisture (e.g., the presence or absence of moisture, a saturation level of moisture, etc.), pressure, temperature, a gas level (e.g., the presence or absence of a particular gas, a saturation level of the particular gas, etc.), and/or proximity. One or more of the various patents and patent applications to which this application claims priority discloses various embodiments of sensor elements 58.

In an example of operation, the processing module 84 enables the RF signal circuit 65 to generate an RF signal 75. This may be done in a calibration mode (e.g., upon initial installation of the sensor 16, when a calibration signal is received or generated, etc.) or in a sense mode (e.g., enabled to sense an environmental condition). In the sense mode, the RF signal circuit 65 may be enabled periodically, randomly, or upon command from a sensor computing device 12.

In the calibration mode, the sensing element 58 is subjected to a known condition (e.g., a known moisture (e.g., dry), a known temperature, a known pressure, a known gas level for a particular type of gas, etc.). With the RF signal circuit 65 transmitting the RF signal 75, the antenna structure 80 receives it. The sensing element 58, being proximal to the antenna structure 80 or integrated into the antenna structure 80, causes a change of an operating characteristic of the antenna structure 80 (e.g., impedance, quality factor, resonance, etc.). The processing module 84 generates a first digital value based on the change of the operating characteristic to represent the known condition. The processing module 84 then writes the first digital value into the memory.

In the sense mode, the sensing element 58 is subjected to an unknown condition (e.g., an unknown moisture level, an unknown temperature, an unknown pressure, an unknown gas level for a particular type of gas, etc.). With the RF signal circuit 65 transmitting the RF signal 75, the antenna structure 80 receives it. The sensing element 58, being proximal to the antenna structure 80, causes a different change of the operating characteristic of the antenna structure 80. The processing module 84 generates a second digital value based on the different change of the operating characteristic to represent the unknown condition. The processing module 84 then writes the second digital value into the memory. Note that the sense mode may be periodically activated to periodically record values of the unknown condition.

Whether the sensor 16 is in the calibration mode or the sense mode, the power circuit 55 needs to provide at least one power supply voltage to power the processing module 84, the RF signal circuit 65, and the memory 88. In an embodiment, the power circuit 55 includes an active power supply circuit (e.g., a battery and a power conversion circuit). In another embodiment, the power circuit 55 includes a passive power supply circuit, which, in turn, includes a power harvesting circuit (e.g., creates a DC voltage from an AC signal, from solar energy, from an ultrasound signal, from movement, and/or a combination thereof) and a power sourcing circuit (e.g., power converter, capacitor, battery, solar cells, and/or any other energy storage device).

Figure 4:
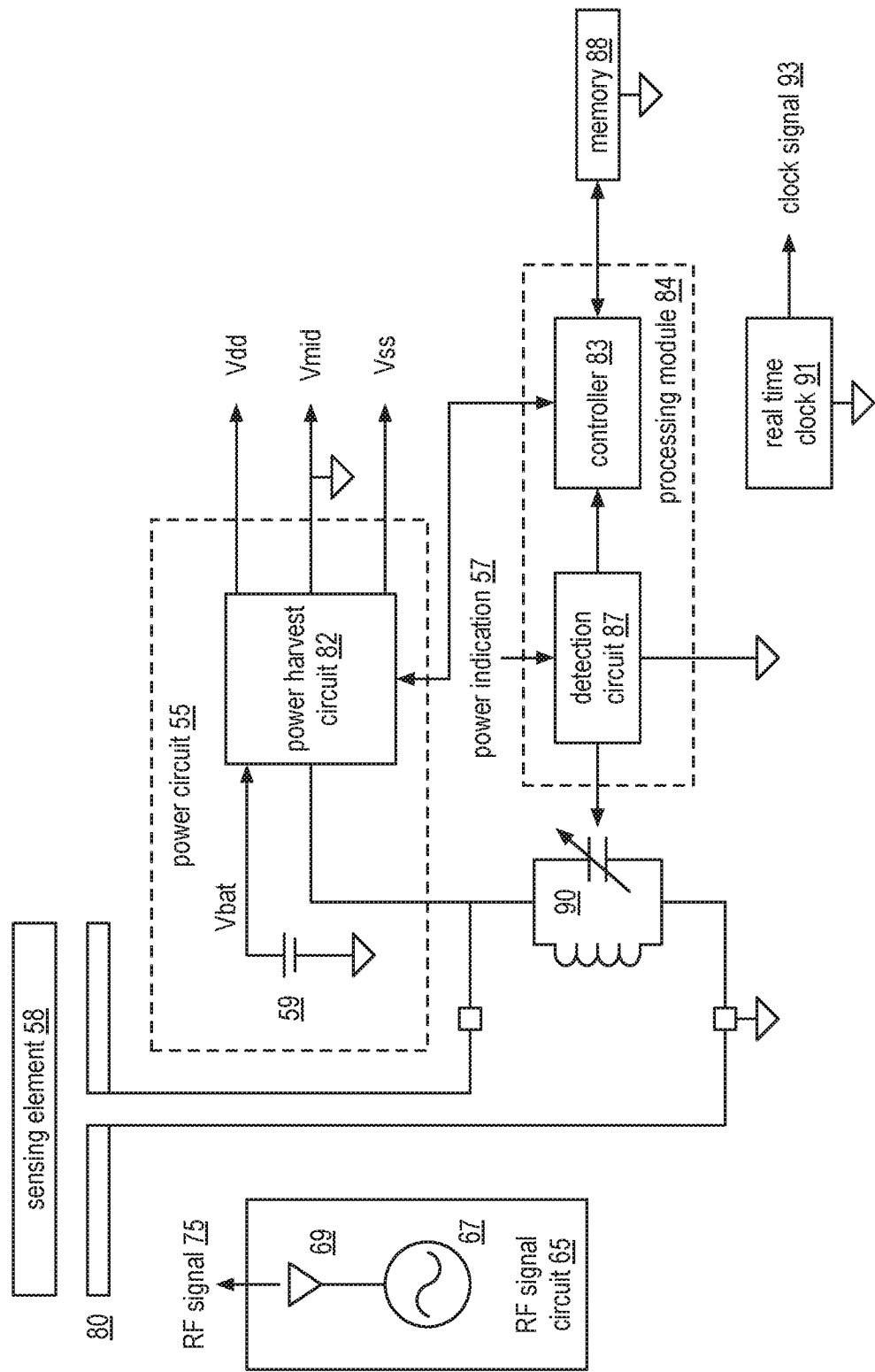
FIG. 4 is a schematic block diagram of another embodiment of a wireless sensor in accordance with the present invention.

FIG. 4 is a schematic block diagram of another embodiment of a wireless sensor 16 that includes the sensing element 58, the antenna structure 80, the RF signal circuit 65, the power circuit 55, the processing module 84, the memory 88, a tuning circuit 90, and a real time clock 91. The RF signal circuit 65 includes an oscillator 67 and an antenna 69. The power circuit 55 includes a battery 59 and a power harvesting circuit 82. The processing module 84 includes a detection circuit 87 and a controller 83. The tuning circuit 90 includes an inductor and a variable capacitance (e.g., a varactor). In an embodiment, a Chameleon integrated circuit manufactured by the Assignee provides the tuning circuit 90 and the processing module 84.

In an example of operation, the controller 83 enables the oscillator 67 to generate an oscillation (e.g., a sinusoidal signal having a frequency corresponding to a carrier frequency of RF signals communicated between the sensor 16 and the sensor computing device 12). The antenna 69 (which may be a loop antenna, a meandering trace, a dipole antenna, a monopole antenna, etc.) transmits the sinusoidal signal as the RF signal 75. The antenna structure 80 (which, in this example, includes a dipole antenna and transmission line) receives the RF signal 75.

The received RF signal 75 is provided to the power harvest circuit 82, which produces a supply voltage (Vdd), a reference voltage (Vss), and a mid voltage (Vmid). The magnitude of the supply voltage (Vdd) is reflective of the input power of the received RF signal. When the input of the sensor 16 (e.g., antenna 80, the tuning circuit 90, and the sensing element 58) is in resonance with the frequency of RF signal, the input power is maximized. When the input of the sensor 16 is not in resonance, the input power decreases proportionally with how far out of resonance the input has become.

The detection circuit 87 generates a control signal that adjusts the capacitance of the tuning circuit 90 (e.g., adjusts the varactor). The detection circuit 87 also monitors a power indication 57 (e.g., the input power, the supply voltage, a supply current, input voltage, etc.) that corresponds to the input power of the RF signal 75 with the current capacitance setting of the tuning circuit 90. When the power indication 57 is at its maximum (or near maximum), the input of the sensor 16 is in resonance (or very close to in resonance) with the RF signal 75.

The controller 83 receives information from the detection circuit 87 regarding the adjusting of the control signal to achieve resonance. The controller 83 generates a digital value corresponding to the adjusting of the control signal to achieve resonance. For instance, if the digital value is an 8-bit binary number, then the digital value will be in the range of 0 to $2^8$. The controller 83 then writes the digital value into the memory.

With the inclusion of a real time clock 91, which produces a clock signal 93, the controller 83 is able to time stamp each generation of a digital value. As such, a historical record of monitoring a condition can be saved in the memory 88 and subsequently retrieved.

Figure 5:
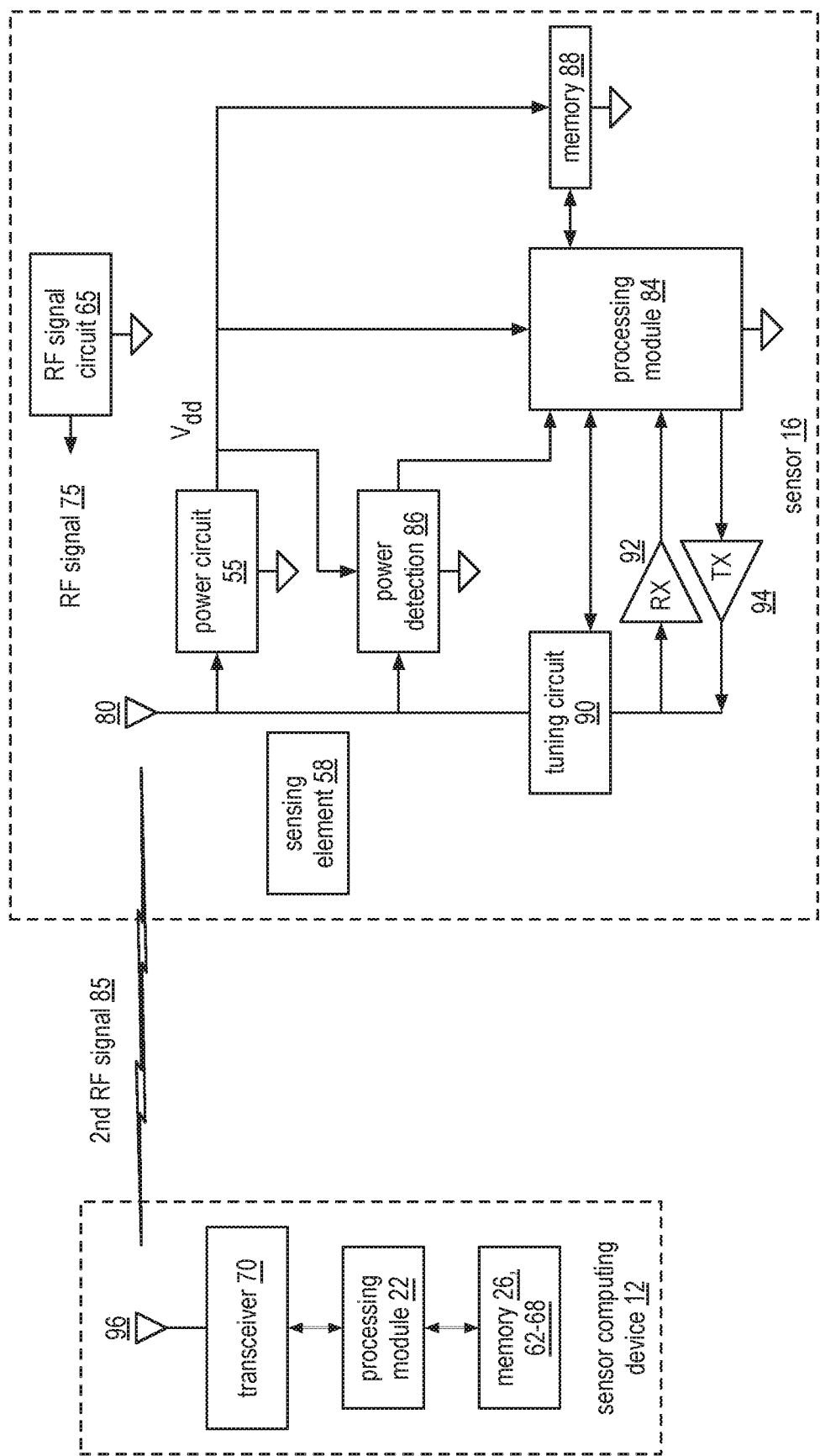
FIG. 5 is a schematic block diagram of an embodiment of a wireless data collecting device and a wireless sensor in accordance with the present invention.

FIG. 5 is a schematic block diagram of an example of a sensor computing device 12 communicating with a passive wireless sensor 16 (e.g., any one of 16-1 through 16-4). The sensor computing device 12 is illustrated in a simplified manner; as such, it shown to include the transceiver 70, an antenna 96, the processing module 22, and the memory (e.g., one or more 26 and 62-68). The wireless sensor 16 includes an antenna 80, one or more sensing elements 58, the RF signal circuit 65, a power harvesting circuit 82, a power detection circuit 86, the processing module 84, memory 88, the tuning circuit 90, a receiver section 92, and a transmitter section 94.

In an example, the sensing element 58 of the wireless sensor 16 senses an environmental condition of an object. The environment condition includes, but is not limited to, one or more of moisture, temperature, pressure, humidity, altitude, sonic wave (e.g., sound), human contact, surface conditions, tracking, location, etc. The object includes one or more of, but is not limited to, a box, a personal item (e.g., clothes, diapers, etc.), a pet, an automobile component, an article of manufacture, an item in transit, etc. The sensing element 58 senses the environmental condition (e.g., moisture) and, as a result of the sensed condition, the sensing element 58 affects an operational parameter (e.g., input impedance, quality factor, frequency, etc.) of an RF front end of the wireless sensor. Note that the RF front end includes one or more of the antenna 80, the tuning circuit 90, the transmitter section 94, the receiver section 92.

As a specific example, the sensing element 58, as a result of the sensed environmental condition, affects the input impedance of the antenna structure 80 and/or of the tuning circuit 90 (e.g., a tank circuit that includes a varactor and one or inductors having a resonant frequency, when tune, that corresponds to the carrier frequency of the second RF signal 85). In response to the impedance change, the processing module 84 adjusts the resonant frequency of the tuning circuit 90 to compensate for the change in input impedance caused by the sensed environmental condition. The amount of adjustment is reflective of the level of the environmental condition (e.g., a little change corresponds to a little moisture; a large change corresponds to a large amount of moisture). The processing module 84 generates a coded value to represent the amount of adjustment and conveys the coded value to the sensor computing device 12 via the transmitter section 94 and the antenna 80 using backscattering or other communication protocol.

In addition to processing the sensed environmental condition, the processing module 84 processes a power level adjustment. For example, the power detection circuit 86 detects a power level of the received RF signal. In one embodiment, the processing module interprets the power level and communicates with the sensor computing device 12 to adjust the power level of the RF signal 85 transmitted by the computing device 12 to a desired level (e.g., optimal for accuracy in detecting the environmental condition). In another embodiment, the processing module 84 includes the received power level data with the environmental sensed data it sends to the sensor computing device 12 so that the computing device can factor the power level into the determination of the environmental condition.

In communication, the sensor computing device 12 transmits a second RF signal 85 to the sensor 16. The second RF signal 85 includes a continuous wave signal that is modulated (e.g., amplitude shift keying) to send the sensor 16 a message. The sensor 16 extracts the message from the second RF signal, which, for example, may be a request to send the collected data to the sensor computing device 12. In response, the sensor retrieves the digital values and corresponding time stamps from the memory and sends them to the sensor computing device 12 via the transmitter.

Figure 6:
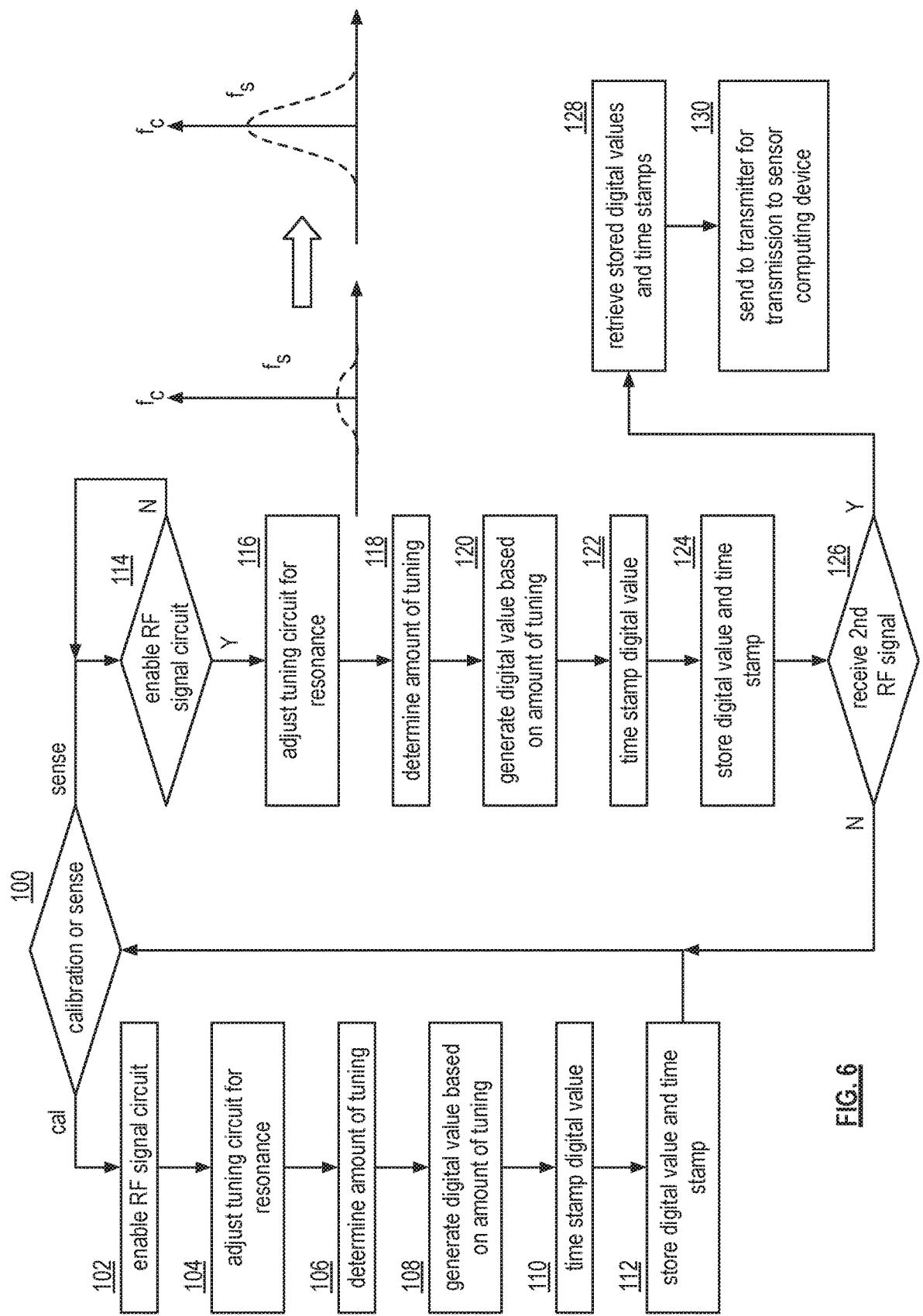
FIG. 6 is a logic diagram of an embodiment of a method of sensing by a wireless sensor in accordance with the present invention.

FIG. 6 is a logic diagram of an embodiment of a method of sensing by a wireless sensor that begins at step 100 where the sensor determines whether it is in a calibration mode or a sense mode. For example, the sensor 16 may receive a signal from the sensor computing device 12 to indicate the calibration mode or the sense mode. As another example, the sensor 16 is powered up in the calibration mode and, after performing a calibration, changes to the sense mode.

When the sensor is in the calibration mode (e.g., sensing a known condition), the method continues to step 102 wherein the RF signal circuit is enabled to generate the RF signal. The method continues at step 104 where the processing module adjusts the tuning circuit to obtain a resonance of the front end of the sensor at the frequency of the RF signal. With reference to the frequency plots on the right of the figure, the first frequency plot is of the front end prior to adjusting the tuning circuit and the one on the right is after adjustment.

The method continues at step 106 where the amount of tuning of the tuning circuit is determined. The method continues at step 108 where a digital value is generated based on the amount of tuning. The method continues at step 110 where the digital value is time stamped using a clock generated by a real time clock circuit. The method continues at step 112 where the time stamped digital value is stored in memory.

When the sensor is in the sense mode (e.g., sensing an unknown condition), the method continues at step 114 where the sensor determines whether to enable the RF signal circuit (e.g., has a periodic interval expired). If not, the method waits until it is time to enable the RF signal circuit. When the RF signal circuit is enabled, the method continues at step 116 where the tuning circuit is adjusted to obtain a resonance of the front end of the sensor at the frequency of the RF signal.

The method continues at step 118 where the amount of tuning of the tuning circuit is determined. The method continues at step 120 where a digital value is generated based on the amount of tuning. The method continues at step 122 where the digital value is time stamped using a clock generated by a real time clock circuit. The method continues at step 124 where the time stamped digital value is stored in memory.

The method continues at step 126 where the sensor determines whether it is receiving a second RF signal that includes a message requesting retrieval of stored data. If not, the method returns to step 100. If it is receiving the second RF signal, the method continues at step 128 where the sensor retrieves the digital values stored in the memory. The method continues at step 130 where the sensor sends, via the transmitter, the retrieved digital values to a sensor computing device 12.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data'.

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

While the transistors in the above described figure(s) is/are shown as field effect transistors (FETs), as one of ordinary skill in the art will appreciate, the transistors may be implemented using any type of transistor structure including, but not limited to, bipolar, metal oxide semiconductor field effect transistors (MOSFET), N-well transistors, P-well transistors, enhancement mode, depletion mode, and zero voltage threshold (VT) transistors.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A radio frequency identification (RFID) tag comprises:
   an antenna structure operable to receive a radio frequency (RF) signal;
   an RF signal circuit operable to, when enabled, produce the RF signal;
   a sensing element operably coupled to the antenna structure, wherein, in a calibration mode, the sensing element is exposed to a known condition and causes a first change in input impedance of the antenna structure while receiving the RF signal and wherein, in a sense mode, the sensing element is exposed to an unknown condition and causes a second change of the input impedance of the antenna structure while receiving the RF signal, and wherein a desired input power level occurs when the antenna structure is in resonance with the RF signal;
   memory; and
   a processing module operable to:
   in the calibration mode:
   measure receive the RF signal at a first input power level from the RF signal;
   adjust the input impedance of the antenna structure until a measured power level of the RF signal is substantially equal to the desired input power level based on a comparison of first input power level and the desired input power level;

generate a first digital value based on an amount of the adjustment the power difference between the first input power level and the desired input power level; and store the first digital value in the memory, wherein the first digital value is representative of the known condition; and in the sense mode:

measure receive the RF signal at a second input power level from the RF signal;

adjust the input impedance of the antenna structure until a second measured power level of the RF signal is substantially equal to the desired input power level based on a comparison of second input power level and the desired input power level;

generate a second digital value based on an amount of the adjustment the power difference between the second input power level and the desired power level; and store the second digital value in the memory, wherein the second digital value is representative of the unknown condition.

2. The RFID tag of claim 1 further comprises:

a power circuit operable to generate a power supply voltage, wherein the power circuit is coupled to the processing module, the RF signal circuit, and the memory.

3. The RFID tag of claim 2, wherein the power circuit comprises one of:

an active power supply circuit; and a passive power supply circuit that includes a power harvesting circuit and a power sourcing circuit.

4. The RFID tag of claim 1, wherein the RF signal circuit comprises:

an oscillator to generate an oscillation; and an antenna operably coupled to transmit the oscillation as the RF signal.

5. The RFID tag of claim 1, wherein the sensing element is operable to sense a condition that comprises one or more of:

a moisture level;

pressure;

temperature;

liquid solution property;

a gas level; and proximity.

6. The RFID tag of claim 1 further comprises:

a real time clock, wherein the processing module is further operable to:

time stamp the first digital value; and time stamp the second digital value.

7. The RFID tag of claim 1, wherein the processing module is further operable to adjust the input impedance in response to an RFID reader command.

8. The RFID tag of claim 1, wherein the processing module is further operable to:

store the first input power level in the memory with the first digital value; and store the second input power level in the memory with second first digital value.

9. The RFID tag of claim 8 further comprises:

a transmitter, wherein:

the antenna structure is operable to receive a second RF signal from an RFID reader;

the processing module is operable to:

extract a message from the second RF signal;

retrieve at least one of the first digital value, the second digital value, the first input power level, and the second input power level from the memory in response to the message; and provide the at least one of the first digital value, the second digital value, the first input power level, and the second input power level to the transmitter for RF transmission to the RFID reader.

10. An active radio frequency identification (RFID) tag comprises:

a battery;

a power circuit operably coupled to generate a power supply voltage from the battery;

an antenna structure operable to receive a radio frequency (RF) signal;

an RF signal circuit operable to, when enabled, produce the RF signal;

a sensing element operably coupled to the antenna structure, wherein, in a calibration mode, the sensing element is exposed to a known condition and causes a first change in input impedance of the antenna structure while receiving the RF signal and wherein, in a sense mode, the sensing element is exposed to an unknown condition and causes a second change of the input impedance of the antenna structure while receiving the RF signal, and wherein a desired input power level occurs when the antenna structure is in resonance with the RF signal;

memory operably coupled to the power supply circuit; and a processing module operably couple to the power supply circuit and to the memory, wherein the processing module is operable to:

in the calibration mode:

receive the RF signal at a first input power level;

adjust the input impedance of the antenna structure until a measured power level of the RF signal is substantially equal to the desired input power level;

generate a first digital value based on an amount of the adjustment; and store the first digital value in the memory, wherein the first digital value is representative of the known condition; and in the sense mode:

receive the RF signal at a second input power level;

adjust the input impedance of the antenna structure until a second measured power level of the RF signal is substantially equal to the desired input power level;

generate a second digital value based on an amount of the adjustment; and store the second digital value in the memory, wherein the second digital value is representative of the unknown condition.

11. The active RFID tag of claim 10, wherein the RF signal circuit comprises:

an oscillator to generate an oscillation; and an antenna operably coupled to transmit the oscillation as the RF signal.

12. The active RFID tag of claim 10, wherein the sensing element is operable to sense a condition that comprises one or more of:

a moisture level;

pressure;

temperature;

liquid solution property;

a gas level; and proximity.

13. The active RFID tag of claim 10 further comprises:
a real time clock, wherein the processing module is further operable to:
time stamp the first digital value; and
time stamp the second digital value.

14. The active RFID tag of claim 10, wherein the processing module is further operable to adjust the input impedance in response to an RFID reader command.

15. The active RFID tag of claim 10, wherein the processing module is further operable to:
store the first input power level in the memory with the first digital value; and
store the second input power level in the memory with second first digital value.

16. The active RFID tag of claim 15 further comprises:
a transmitter, wherein:
the antenna structure is operable to receive a second RF signal from an RFID reader;
the processing module is operable to:
extract a message from the second RF signal;
retrieve at least one of the first digital value, the second digital value, the first input power level, and the second input power level from the memory in response to the message; and
provide the at least one of the first digital value, the second digital value, the first input power level, and the second input power level to the transmitter for RF transmission to the RFID reader.

* * * * *